US011221359B2

(12) United States Patent
Kong et al.

(10) Patent No.: US 11,221,359 B2
(45) Date of Patent: Jan. 11, 2022

(54) DETERMINING DEVICE OPERABILITY VIA METAL-INDUCED LAYER EXCHANGE

(71) Applicant: International Business Machines Corporation, Armonk, NY (US)

(72) Inventors: Dexin Kong, Guilderland, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 157 days.

(21) Appl. No.: 16/355,279

(22) Filed: Mar. 15, 2019

(65) Prior Publication Data

US 2020/0292611 A1 Sep. 17, 2020

(51) Int. Cl.
*G01R 31/26* (2020.01)
*H01C 7/00* (2006.01)

(52) U.S. Cl.
CPC ..... *G01R 31/2644* (2013.01); *G01R 31/2601* (2013.01); *H01C 7/006* (2013.01)

(58) Field of Classification Search
CPC ......... H01L 21/02532; H01L 21/02672; H01L 21/324; G01R 31/2644; G01R 31/2875
USPC ....................................................... 257/48
See application file for complete search history.

(56) References Cited

U.S. PATENT DOCUMENTS

| 5,070,384 | A | 12/1991 | McCollum et al. |
| 7,592,876 | B2 | 9/2009 | Newman |
| 8,043,943 | B2 | 10/2011 | Maboudian et al. |
| 8,054,253 | B2 | 11/2011 | Yoo |
| 8,274,301 | B2 | 9/2012 | Feng et al. |
| 9,099,411 | B2 | 8/2015 | Hu et al. |
| 9,818,607 | B2 | 11/2017 | Kwok et al. |
| 2010/0059756 | A1* | 3/2010 | Park ................. H01L 29/78609 257/66 |
| 2012/0193687 | A1 | 8/2012 | Kim et al. |
| 2013/0048985 | A1* | 2/2013 | Hu .......................... H01L 21/324 257/52 |
| 2016/0020095 | A1* | 1/2016 | Kwok ............... H01L 29/66757 257/64 |
| 2016/0268320 | A1* | 9/2016 | Long .................... H01L 29/4908 |
| 2017/0077183 | A1* | 3/2017 | Ikedo .................... H01L 27/222 |

(Continued)

OTHER PUBLICATIONS

Wang, Mingxiang, et al. "The effects of high temperature annealing on metal-induced laterally crystallized polycrystalline silicon," IEEE Transactions on Electron Devices, vol. 47, No. 11, 2000, pp. 2061-2067. 7 pages.

(Continued)

*Primary Examiner* — Duy T Nguyen
(74) *Attorney, Agent, or Firm* — Amin, Turocy & Watson, LLP

(57) ABSTRACT

Techniques regarding determining device operability via a metal-induced layer exchange are provided. For example, one or more embodiments described herein can comprise an apparatus, which can comprise a dielectric membrane positioned between an amorphous semiconductor resistor layer and an electrically conductive metal layer. The dielectric membrane can facilitate a metal induced layer exchange that can experiences catalyzation by heat generated from operation of a semiconductor device positioned adjacent to the apparatus.

8 Claims, 17 Drawing Sheets

(56) References Cited

U.S. PATENT DOCUMENTS

2017/0221929 A1* 8/2017 Yu .................... H01L 21/26513
2018/0069023 A1* 3/2018 Ma .................... H01L 21/02216

OTHER PUBLICATIONS

Wooters, S. N., et al. "Tracking On-Chip Age Using Distributed, Embedded Sensors," IEEE Transactions on Very Large Scale Integration (VLSI) Systems, vol. 20, No. 11, 2012, pp. 1974-1985. 12 pages.
Nast, Oliver, et al. "Aluminum-induced crystallization of amorphous silicon on glass substrates above and below the eutectic temperature." Applied Physics Letters 73, 3214 (1998); doi: 10.1063/1.122722. 3 pages.

* cited by examiner

MONITORING AN ELECTRICAL CURRENT TRAVELING THROUGH A MONITOR POSITIONED ADJACENT TO A SEMICONDUCTOR DEVICE, WHEREIN AN AMOUNT OF ELECTRICAL CURRENT TRAVELING THROUGH THE MONITOR IS A FUNCTION OF A METAL-INDUCED LAYER EXCHANGE WITHIN THE MONITOR ← 1602

DETERMINING AN OPERABILITY OF THE SEMICONDUCTOR DEVICE BASED ON THE MONITORING ← 1604

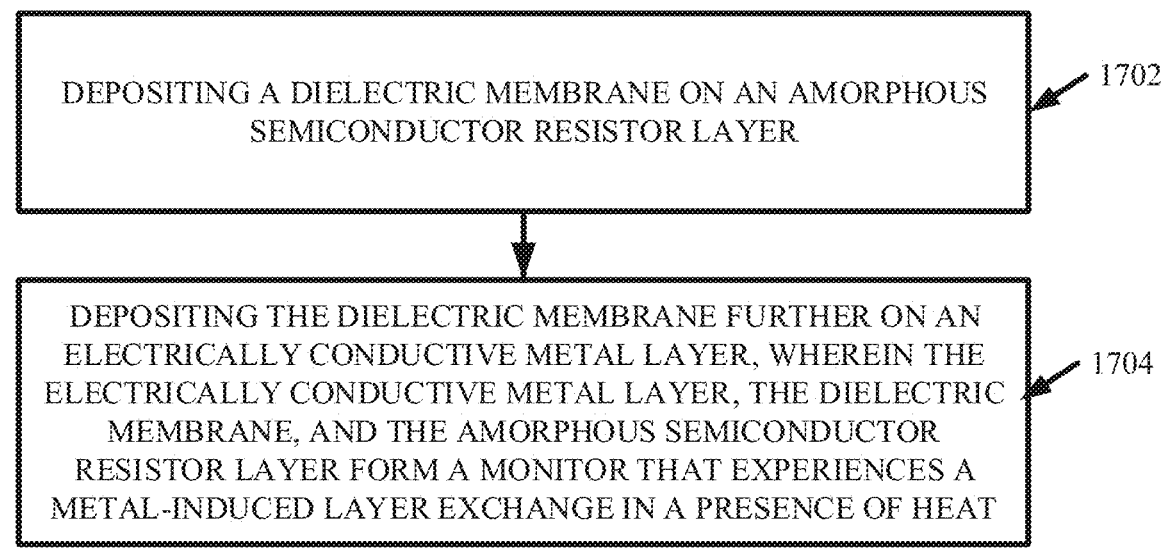

DETERMINING DEVICE OPERABILITY VIA METAL-INDUCED LAYER EXCHANGE

BACKGROUND

The subject disclosure relates to determining the operability of a semiconductor device, and more specifically, to determining the semiconductor device's operability by monitoring a metal-induced layer exchange ("MILE").

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, apparatuses, and/or methods regarding monitoring the operability of a semiconductor device based on a MILE are described.

According to an embodiment, an apparatus is provided. The apparatus can comprise a dielectric membrane positioned between an amorphous semiconductor resistor layer and an electrically conductive metal layer. The dielectric membrane can facilitate a metal induced layer exchange that can experiences catalyzation by heat generated from operation of a semiconductor device positioned adjacent to the apparatus.

According to an embodiment, a method is provided. The method can comprise monitoring an electrical current traveling through a monitor positioned adjacent to a semiconductor device. An amount of the electrical current traveling through the monitor is a function of a metal induced layer exchange within the monitor. The method can also comprise determining an operability of the semiconductor device based on the monitoring.

According to an embodiment, a method is provided. The method can comprise depositing a dielectric membrane on an amorphous semiconductor resistor layer. Also, the method can comprise depositing the dielectric membrane further on an electrically conductive metal layer. The electrically conductive metal layer, the dielectric membrane, and the amorphous semiconductor resistor layer can form a monitor that can experience a metal induced layer exchange in a presence of heat.

BRIEF DESCRIPTION OF THE DRAWINGS

FIG. 16 illustrates a flow diagram of an example, non-limiting method that can facilitate using one or more monitors, which can detect the operability of a semiconductor device using a metal-induced layer exchange in accordance with one or more embodiments described herein.

FIG. 17 illustrates a flow diagram of an example, non-limiting method that can facilitate manufacturing one or more monitors, which can detect the operability of a semiconductor device using a metal-induced layer exchange in accordance with one or more embodiments described herein.

DETAILED DESCRIPTION

Figure 1A:
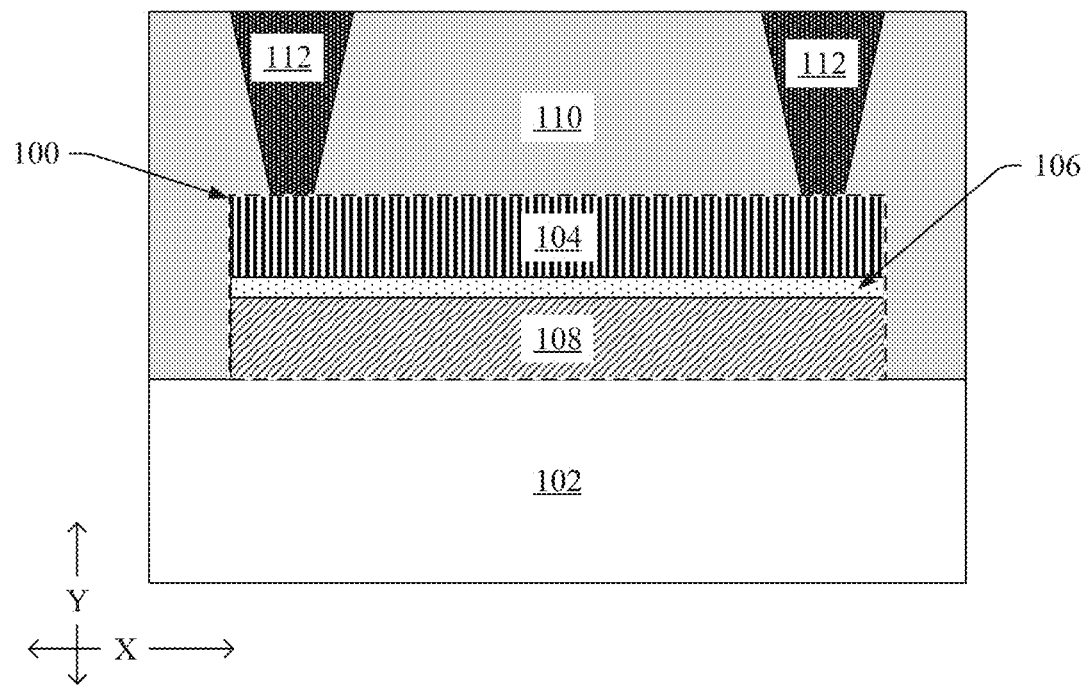
FIG. 1A illustrates a diagram of an example, non-limiting monitor that can detect the operability of a semiconductor device using a metal-induced layer exchange in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, features depicted in the drawings with like shading, cross-hatching, and/or coloring can comprise shared compositions and/or materials.

Monitoring the operation lifetime of electronic devices is of high importance in the modern computing industry. Device failure associated with prolonged operation can result in data loss, system failure, and/or a reduction in productivity. Conventional operation lifetime monitoring techniques monitor the lifetime of electronic devices indiscriminately of the devices' operation history. Thus, conventional monitoring techniques can fail to account for periods of time in which the electronic devices are turned off, and thereby not affecting the operation lifetime of the devices.

Various embodiments described herein can regard apparatuses, systems, and/or methods regarding monitoring the operation lifetime of one or more semiconductor devices based on a MILE that can based on active operation of the one or more semiconductor devices. For example, one or more embodiments can comprise a monitor device that can experience a MILE in the presence of heat generated by operation of the one or more semiconductor devices. The monitor device can be positioned adjacent to the one or more semiconductor devices, and can comprise one or more dielectric membranes positioned between one or more resistor layers and metal layers. The MILE can be catalyzed by heat generated via operation of the one or more semiconductor devices and can facilitate an exchange of material between the one or more resistor layers and metal layers that can alter the electrical resistance of the monitor device. Thus, a determination regarding the operability of the one or more semiconductor devices can be made by monitoring the amount of current flowing through the monitor device. Advantageously, the monitor device can enable operability determinations that account for the operation history of the one or more semiconductor devices.

As described herein, the term "deposition process" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), molecular beam epitaxy ("MBE"), atomic layer deposition ("ALD"), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition (PVD), chemical oxidation, sputtering, plating, evaporation, spin-on-coating, ion beam deposition, electron beam deposition, laser assisted deposition, chemical solution deposition, a combination thereof, and/or the like. For instance, a deposition process can include one or more epitaxial growth processes that can grow single crystalline material on a single crystalline substrate.

As described herein, the terms "etching process" and/or "removal process" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

FIG. 1A illustrates a diagram of an example, non-limiting monitor device 100 that can monitor the operability of a semiconductor device based on a MILE in accordance with one or more embodiments described herein. Repetitive description of like elements employed in other embodiments described herein is omitted for sake of brevity. As shown in FIG. 1A, the monitor device 100 is delineated with dashed lines and can comprise one or more resistor layers 104, dielectric membranes 106, and/or metal layers 108.

The monitor device 100 can be positioned adjacent to one or more device layers 102 of a semiconductor device subject to monitoring by the monitor device 100. For example, the one or more device layers 102 can comprise a dielectric material. Further the one or more device layers 102 can electrically isolate the subject semiconductor device from the monitor device 100. Example materials that can be comprised within the one or more device layers 102 can include, but are not limited to: glass, electrical insulator (e.g., silicon oxide, silicon nitride, silicon oxycarbide (SiOC), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), methyl doped silica (SiO:(CH3)), organosilicate glass (SiCOH), porous SiCOH), a combination thereof, and/or the like. An exemplary thickness (e.g., along the "Y" axis) of the one or more device layers 102 can be greater than or equal to 100 nanometers (nm) and less than or equal to 1 millimeter (mm). In various embodiments, the monitor device 100 can be positioned on the one or more device layers 102 near a heat generating feature of the adjacent semiconductor device (e.g., near a "hot-spot" of the semiconductor device). For example, one or more features of the semiconductor device can generate heat during operation, wherein the monitor device 100 can be positioned on the one or more device layers 102 near the one or more features (not shown). For instance, the monitor device 100 can be positioned on the one or more device layers 102 near one or more processors of the semiconductor device, wherein the one or more processors can generate heat during operation.

In one or more embodiments, the one or more metal layers 108 can be adjacent (e.g., disposed onto) the one or more device layers 102. The one or more metal layers 108 can be electrically conductive. Example materials that can be comprised within the one or more metal layers 108 can include but are not limited to: aluminum (Al), gold (Au), silver (Ag), antimony (Sb), indium (In), nickel (Ni), cobalt (Co), titanium (Ti), zinc (Zn), iron (Fe), platinum (Pt), tin (Sn), palladium (Pd), tungsten (W), molybdenum (Mo), niobium (Nb), zirconium (Zr), hafnium (Hf), Tantalum (Ta), Ruthenium (Ru), yttrium (Y), lanthanum (La), a combination thereof, and/or the like. An exemplary thickness (e.g., along the "Y" axis) of the one or more metal layers 108 can be greater than or equal to 5 nm and less than or equal to 100 micron meters (μm). An exemplary width (e.g., along the "X" axis) of the one or more metal layers 108 can be greater than or equal to 50 nm and less than or equal to 500 μm.

The one or more dielectric membranes 106 can be positioned between the one or more resistor layers 104 and the one or more metal layers 108. The one or more dielectric membranes 106 can serve as interface between the one or more resistor layers 104 and the one or more metal layers 108 to facilitate a MILE. In various embodiments, the one or more dielectric membranes 106 can comprise a dielectric film and/or a metal oxide dielectric. Example materials that can be comprised within the one or more dielectric membranes 106 can include, but are not limited to: metal oxides (e.g., aluminum oxide ($Al_2O_3$)), silicon oxide, germanium oxide, silicon germanium oxide, a combination thereof, and/or the like. An exemplary thickness (e.g., along the "Y" axis) of the one or more dielectric membranes 106 can be greater than or equal to 0.5 nm and less than or equal to 5 nm.

Further, the one or more resistor layers 104 can be adjacent to (e.g., disposed onto) the one or more dielectric membranes 106 opposite the one or more metal layers 108 (e.g., as shown in FIG. 1A). The one or more resistor layers 104 can be comprised of an amorphous semiconductor material. Example materials that can be comprised within the one or more resistor layers 104 can include, but are not limited to: amorphous silicon (aSi), amorphous germanium (aGe), amorphous silicon-germanium (aSi/Ge), a combination thereof, and/or the like. In some embodiments, the one or more resistor layers 104 may further comprise dopants. For example, for aSi, aGe, or aSi/Ge, an n-type dopant can be selected from a group of phosphorus (P), arsenic (As), and/or antimony (Sb); and a p-type dopant can be selected from a group of boron (B), gallium (Ga), and/or indium (In). In the case of doping, the doping concentration can range from $10^{16}/cm^3$ to $10^{21}/cm^3$. An exemplary thickness (e.g., along the "Y" axis) of the one or more resistor layers 104 can be greater than or equal to 10 nm and less than or equal to 500 nm. An exemplary width (e.g., along the "X" axis) of the one or more resistor layers 104 can be greater than or equal to 50 nm and less than or equal to 500 μm. In various embodiments, the one or more resistor layers 104 can have a greater electrical resistance than the one or more metal layers 108. For example, the one or more resistor layers 104 can be characterized by an electrical resistance greater than or equal to 0.01 ohms cm (Ωcm) and less than or equal to $10^5$ Ωcm. Preferably, the resistivity of the one or more resistor layers 104 ranges from 1000 Ωcm to 10,000 Ωcm. Although the monitor device 100 shown in FIG. 1A is depicted as a straight line along "X" axis, it can have other configurations, such as a serpentine shape.

Additionally, the monitoring device 100 can be at least partially encapsulated by one or more dielectric layers 110. As shown in FIG. 1A, the one or more dielectric layers 110 can at least partially surround the sides and top of the monitor device 100, wherein the one or more dielectric layers 110 can extend around the monitor device 100 to the one or more device layers 102. Example materials that can be comprised within the one or more dielectric layers 110 can include, but are not limited to: silicon oxide, silicon nitride, silicon oxynitride, silicon oxycarbide (SiOC), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), methyl doped silica (SiO:(CH3)), organosilicate glass (SiCOH), porous SiCOH, a combination thereof, and/or the like. An exemplary thickness (e.g., along the "Y" axis) of the one or more dielectric layers 110 can be greater than or equal to 50 nm and less than or equal to 10 μm.

Further, one or more contacts 112 can extend through the one or more dielectric layers 110 to the monitor device 100. For example, the one or more contacts 112 can extend through the one or more dielectric layers 110 and be operably coupled to the one or more resistor layers 104 (e.g., as shown in FIG. 1A). In various embodiments, the one or more contacts 112 can be positioned within one or more vias in the one or more dielectric layers 110. The one or more contacts 112 can comprise one or more electrically conductive metals to carry a current to and/or from the monitor device 100. For example, one of the contacts 112 can be an electrically biased contact and another contact 112 can be a ground contact. Thereby, current can flow from a first contact 112, through the monitor device 100 (e.g., through the one or more resistor layers 104), and to a second contact 112. In one or more embodiments, the monitor device 100 can be further coupled to one or more ammeters (not shown), which can measure the amount of current flowing through the monitor device 100. For example, the one or more ammeters can be operably coupled to the monitor device 100 via the one or more contacts 112.

In various embodiments, operation of the adjacent semiconductor device can generate heat, which can be greater than or equal to an annealing temperature that can catalyze a MILE within the monitor device 100. An example annealing temperature that can be achieved by operation of the semiconductor device, and can facilitate the MILE, can be greater than or equal to 40 degrees Celsius (° C.) and less than or equal to 250° C. During the MILE, material from the one or more resistor layers 104 can exchange position with material from the one or more metal layers 108, and vise versa. The amount of heat catalyzing the MILE can be dependent on the amount of operation of the semiconductor device, and thereby the amount MILE experienced by the monitor device 100 is also dependent on the amount of operation of the semiconductor device. For example, the more times the semiconductor device is operated, the more times the MILE is catalyzed. Also, the longer the semiconductor device is operated, the longer the MILE is catalyzed.

As the monitor device 100 experiences the MILE, the composition of the one or more layers operably coupled to the one or more contacts 112 can change; thereby, the electrical resistance of the one or more layers operably coupled to the one or more contacts 112 can also change. For example, wherein the one or more contacts 112 are operably coupled to the one or more resistor layers 104 (e.g., as shown in FIG. 1A), an electrical current carried by the contacts 112 can experience less resistance passing through monitor device 100 as a result of the MILE. For instance, as material (e.g., electrically conductive metal) from the one or more metal layers 108 exchanges position with material from the one or more resistor layers 104, more material from the one or more metal layers 108 can become operably coupled to the one or more contacts 112 and thereby lower the electrical resistance of the monitor device 100 (e.g., as compared to the electrical resistance characterizing the monitor device 100 prior to the MILE). Therefore, the longer the MILE progresses, the lesser the electrical resistance of the monitor device 100.

The electrical resistance of the monitor device 100 can experience change due to the MILE while the semiconductor device is operating (e.g., generating heat) and can cease experiencing change when the semiconductor device is not operating (e.g., when the heat is absent). Thus, the electrical resistance of the monitor device 100 can be dependent on the amount of MILE experienced by the monitor device 100, which can further be dependent on the amount of operation experienced by the semiconductor device (e.g., the amount of heat generated by the operation). Therefore, current can be supplied to the monitor device 100 via the one or more contacts 112 and monitored for changes that can be indicative of the operation of the semiconductor device. For example, the amount of electrical current flowing through the monitor device 100 can be measured continuously and/or in intervals. For instance, the amount of electrical current flowing through the monitor device 100 can be measured based on an event (e.g., when the semiconductor device is powered on) and/or a time interval (e.g., once a day at a scheduled time).

For example, an initial electrical resistance of the monitor device 100 can be greater than or equal to 10 giga-ohms (G$\Omega$) (e.g., the electrical resistance of the initial composition of one or more resistor layers 104 as shown in FIG. 1A). The 10 G$\Omega$ resistance can result in an initial current passing through the monitor device 100 of less than or equal to 0.1 nanoamperes (nA). Operation of the adjacent semiconductor device can catalyze the MILE within the monitor device 100 and lower the electrical resistance (e.g., to an amount less than 10 G$\Omega$). The more operating time of the adjacent semiconductor device (e.g., the longer the MILE is catalyzed) the more the electrical resistance can be reduced (e.g., to an electrical resistance below 10 G$\Omega$). As the electrical resistance reduces, the amount of current passing through the monitor device 100 can increase (e.g., to an amount greater than 0.1 nA).

In various embodiments, a change in the measured electrical current of the monitor device 100 beyond a defined threshold can be indicative of an operability of the adjacent semiconductor device. For example, wherein the adjacent semiconductor device can have an operable lifetime of X years (e.g., after X years of operation, the semiconductor device can be inoperable), a current threshold can define the amount of electrical current that can flow through the monitor device 100 after 0.5X years of MILE catalyzed by operation of the adjacent semiconductor device. Thereby, a measured electrical current flowing through the monitor device 100 that exceeds the current threshold (e.g., goes beyond a maximum threshold or below a minimum threshold) can be indicative that the adjacent semiconductor device has reached and/or is beyond half the operable lifetime. In another example, a current threshold can define the amount of electrical current that can flow through the monitor device 100 once the monitor device 100 has experienced MILE for an amount of time equivalent to the operably lifetime of an adjacent semiconductor device. Thereby, a measured electrical current flowing through the monitor device 100 that exceeds the current threshold (e.g., goes beyond a maximum threshold or below a minimum threshold) can be indicative that the adjacent semiconductor device has reached and/or is beyond the operable lifetime.

One of ordinary skill in the art will recognize that the thickness (e.g., along the "Y" axis) of the one or more resistor layers 104, dielectric membranes 106, and/or metal layers 108 can be tuned to account for the operable lifetime of the adjacent semiconductor device. For example, the thickness of the monitor device 100 can be thinner when positioned adjacent to semiconductor devices with shorter operable lifetimes and thicker when positioned adjacent to semiconductor device with longer operable lifetimes. Further, while FIG. 1A depicts a single monitor device 100 on the device layer 102 of the adjacent semiconductor device, the architecture is not so limited. For example, a plurality of monitor devices 100 can be positioned adjacent on the device layer 102.

Figure 1B:
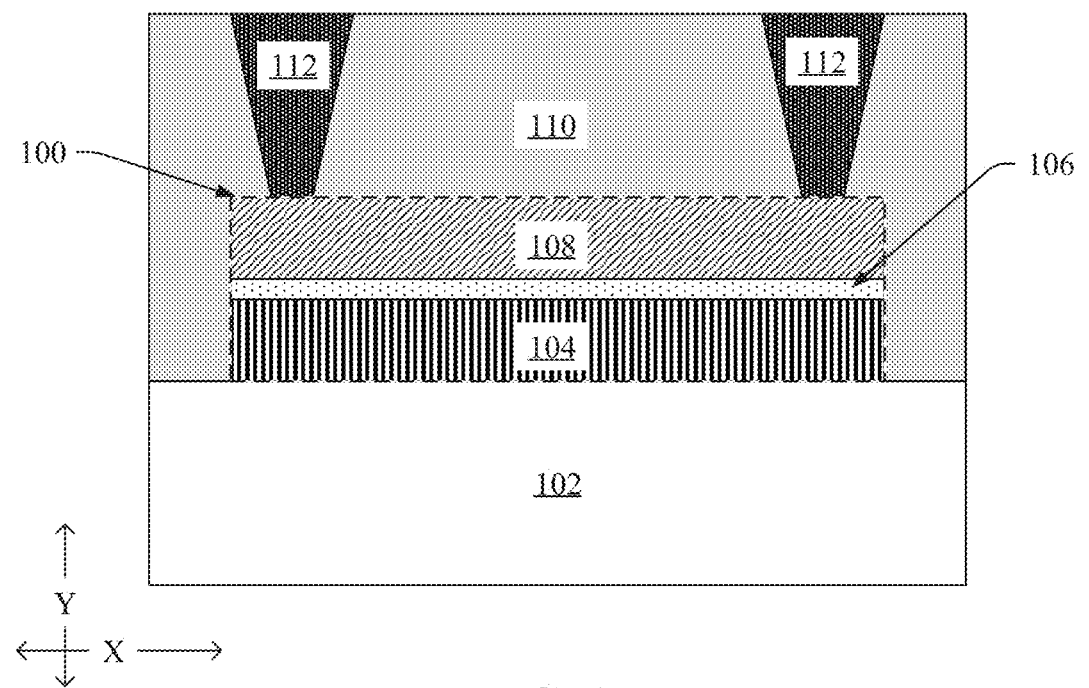
FIG. 1B illustrates a diagram of an example, non-limiting monitor that can detect the operability of a semiconductor device using a metal-induced layer exchange in accordance with one or more embodiments described herein.

FIG. 1B illustrates a diagram of the example, non-limiting monitor device 100 that can monitor the operability of a semiconductor device based on a MILE in accordance with one or more embodiments described herein. Repetitive description of like elements employed in other embodiments described herein is omitted for sake of brevity. As shown in FIG. 1B, one or more embodiments can comprise the one or more resistor layers 104 positioned adjacent to (e.g., disposed onto) the one or more device layers 102, and the one or more metal layers 108 operably coupled to the one or more contacts 112.

The structural configuration depicted in FIG. 1B can comprise the same features and/or functionality as described above with regards to FIG. 1A. However, the amount of current flowing through the monitor device 100 of FIG. 1B can be reduced as a result of the MILE; whereas the amount of current flowing through the monitor device 100 of FIG. 1A can increase as a result of the MILE. For example, the initial amount of current flowing through the monitor device 100 of FIG. 1B can be higher than the initial amount of current flowing through the monitor device 100 of FIG. 1A at least because the one or more metal layers 108, rather than the one or more resistor layers 104, can be operably coupled to the one or more contacts 112 in the monitor device 100 of FIG. 1B (e.g. wherein the one or more metal layers 108 can have a lower electrical resistance than the one or more resistor layers 104). As the monitor device 100 of FIG. 1B experiences the MILE, material from the one or more metal layers 108 can exchange position with material from the one or more resistor layers 104, and thereby material from the one or more resistor layers 104 can become operably coupled to the one or more contacts 112 and increase the electrical resistance of the monitor device 100. In other words, as the monitor device 100 of FIG. 1B experiences the MILE (e.g., catalyzed by operation of the adjacent semiconductor device), the electrical resistance of the monitor device 100 can increase and the amount of current flowing through the monitor device 100 can decrease.

As described herein with regards to FIG. 1A, the amount of current flowing through the monitor device 100 of FIG. 1B can be indicative of the amount of MILE experienced, and thereby can be indicative of the amount of operation of the adjacent semiconductor device. For example, as the operational time of the adjacent semiconductor device increases, the amount of current flowing through the monitor device 100 of FIG. 1B can decrease. Exceeding one or more current thresholds (e.g., measuring an amount of current less than a defined threshold) can be indicative of the operability of the adjacent semiconductor device.

Figure 2A:
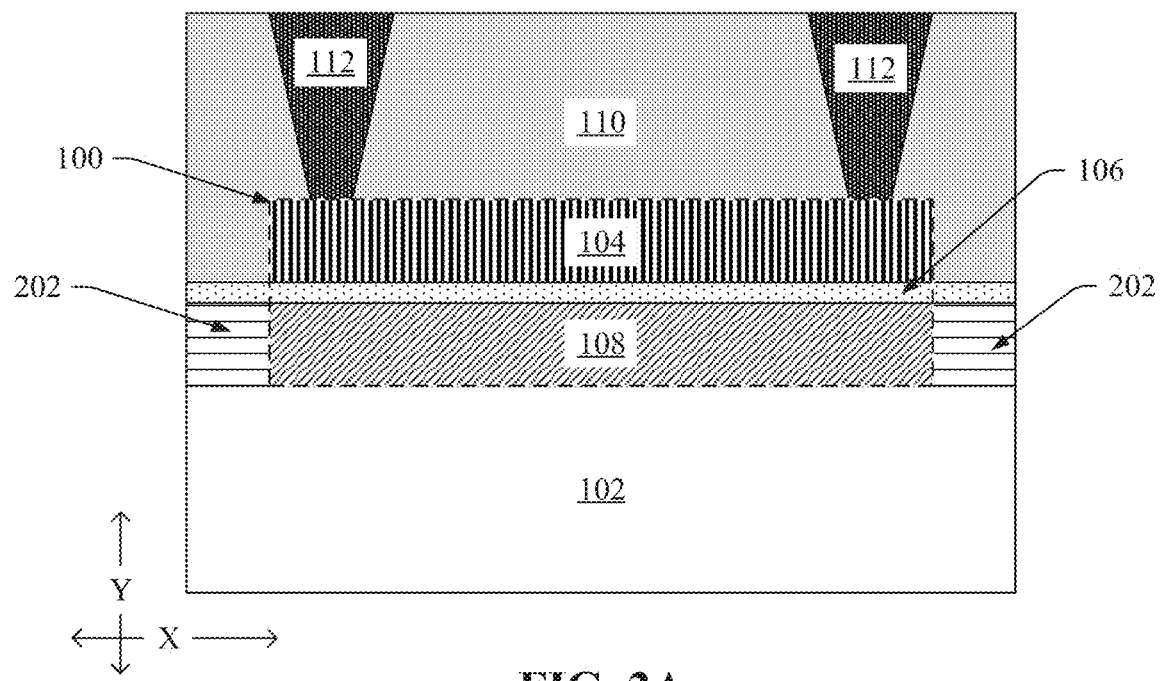
FIG. 2A illustrates a diagram of an example, non-limiting monitor that can detect the operability of a semiconductor device using a metal-induced layer exchange in accordance with one or more embodiments described herein.
Figure 2B:
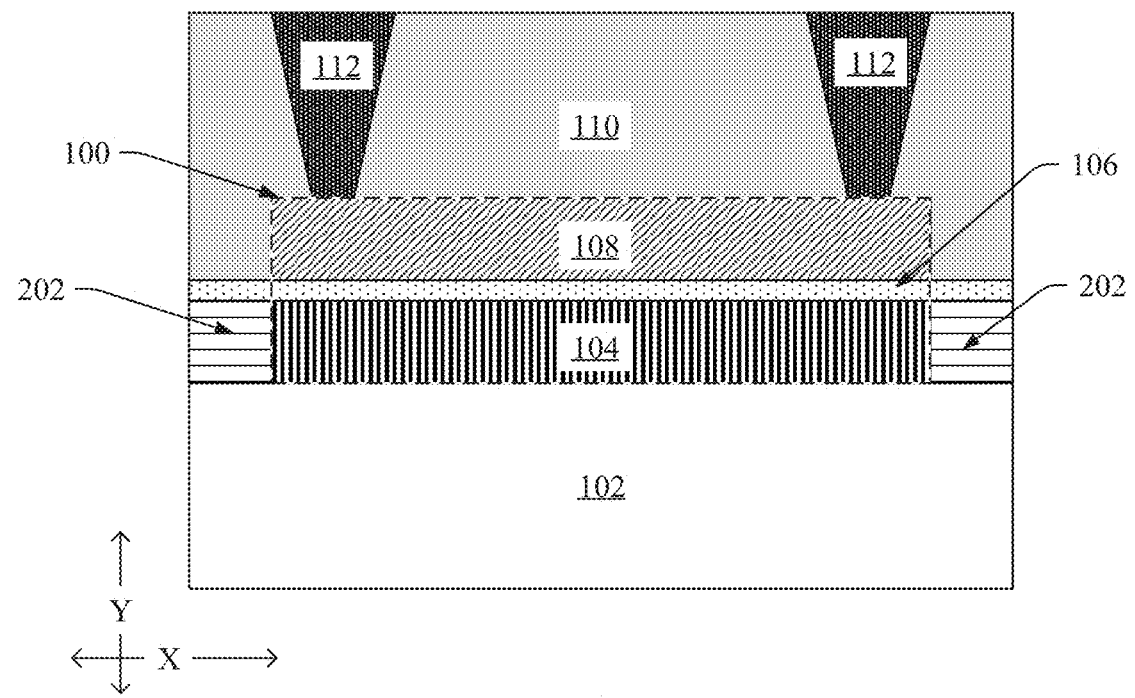
FIG. 2B illustrates a diagram of an example, non-limiting monitor that can detect the operability of a semiconductor device using a metal-induced layer exchange in accordance with one or more embodiments described herein.

FIGS. 2A and 2B illustrate diagrams of the example, non-limiting monitor device 100 that can monitor the operability of a semiconductor device based on a MILE in accordance with one or more embodiments described herein. Repetitive description of like elements employed in other embodiments described herein is omitted for sake of brevity.

The monitor device 100 shown in FIG. 2A can have the same configuration depicted in FIG. 1A (e.g., the one or more resistor layers 104 can be operably coupled to the one or more contacts 112). Likewise, the monitor device 100 shown in FIG. 2B can have the same configuration depicted in FIG. 1B (e.g., the one or more metal layers 108 can be operably coupled to the one or more contacts 112).

As shown in FIGS. 2A and/or 2B, the one or more dielectric membranes 106 can extend (e.g., along the "X" axis) outside the monitor device 100 and separate the one or more dielectric layers 110 from one or more second dielectric layers 202. For instance, the one or more second dielectric layers 202 can be positioned adjacent to the monitor device 100 and the one or more device layers 102; whereas the one or more dielectric layers 110 can be positioned adjacent to the monitor device 100 and the one or more contacts 112, wherein the one or more dielectric membranes 106 can be further positioned between the one or more dielectric layers 110 and second dielectric layers 202 (e.g., as shown in FIGS. 2A and/or 2B). Example materials that can be comprised within the one or more second dielectric layers 202 can include, but are not limited to: silicon oxide, silicon nitride, silicon oxynitride, silicon oxycarbide (SiOC), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), methyl doped silica (SiO:(CH3)), organosilicate glass (SiCOH), porous SiCOH, a combination thereof, and/or the like. In one or more embodiments, the one or more dielectric layers 110 and second dielectric layers 202 can have the same, or substantially the same, composition. Alternatively, in one or more embodiments the one or more dielectric layers 110 and second dielectric layers 202 can have a different composition.

Figure 3:
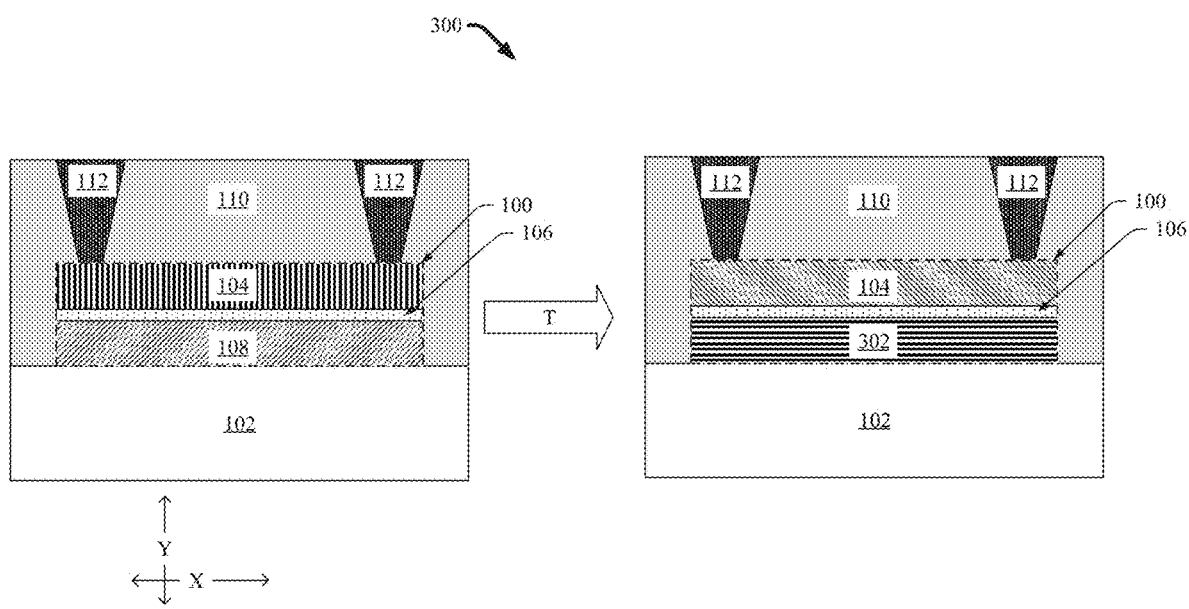
FIG. 3 illustrates a diagram of an example, non-limiting metal-induced layer exchange process that one or more monitors can undergo in accordance with one or more embodiments described herein.

FIG. 3 illustrates a diagram of a non-limiting, exemplary MILE process 300 that can be experienced by the monitor device 100 in accordance with one or more embodiments described herein. Repetitive description of like elements employed in other embodiments described herein is omitted for sake of brevity. As shown in FIG. 3, the monitor device 100 of the exemplary MILE process 300 is configured as shown in FIG. 1A; however, the various features described herein with regards to exemplary MILE process 300 can also be applicable to the other monitor device 100 configurations described herein (e.g., as shown in FIGS. 1B, 2A, and/or 2B).

As shown in FIG. 3, "T" can represent an annealing temperature facilitated by heat generated during operation of the adjacent semiconductor device. For example, the annealing temperature can be greater than or equal to 40° C. and less than or equal to 250° C. As a result of the exemplary MILE process 300, the one or more metal layers 108 can exchange position with the one or more resistor layers 104. For example, wherein the one or more metal layers 108 can be positioned adjacent to the one or more device layers 102 at the start of the exemplary MILE process 300, the one or more metal layers 108 can move to a new position that is operably coupled to the one or more contacts 112 during and/or subsequent to the exemplary MILE process 300. In other words, the exemplary MILE process 300 can facilitate a migration of the one or more metal layers 108 across the one or more dielectric membranes 106. Further, the one or more resistor layers 104 can migrate within the monitor device 100 during the exemplary MILE process 300. For example, the one or more resistor layers 104 can leave a position operably coupled to the one or more contacts 112 to a position adjacent to the one or more device layers 102 (e.g., to a position previously occupied by the one or more metal layers 108).

Moreover, the annealing temperature (e.g., represented by "T") can facilitate the described exchange in addition to a change in the composition of the material comprised within the one or more resistor layers 104. As a result of the exemplary MILE process 300, the composition of the one or more resistor layers 104 can be altered during migration within the monitor device 100. Thus, the exemplary MILE process 300 can form one or more modified layers 302 in addition to migrating the one or more metal layers 108 to a different position across the one or more dielectric membranes 106 as an exchange with the one or more resistor layers 104.

The one or more modified layers 302 can comprise materials derived from the one or more resistor layers 104 as a result of the exemplary MILE process 300. Example materials that can be comprised within the one or more modified layers 302 can include, but are not limited to: polycrystalline silicon, epitaxial silicon, polycrystalline germanium, epitaxial germanium, polycrystalline silicon-germanium, epitaxial silicon-germanium, a combination thereof and/or the like. In various embodiments, the one or more modified layers 302 can have a higher electrical resistance than the one or more metal layers 108. Thus, the exemplary MILE process 300 can exchange the position of the one or more metal layers 108 with the one or more resistor layers 104 (e.g., facilitate a migration across the one or more dielectric membranes 106) and/or modify the composition of the one or more resistor layers 104 to form one or more modified layers 302 (e.g., as shown in FIG. 3).

As a result of the exemplary MILE process 300, the one or more metal layers 108 can be exchanged with the one or more resistor layers 104, and thereby migrate across the one or more dielectric membranes 106 to a position that can be operably coupled to one or more contacts 112. Additionally, the one or more resistor layers 104 can migrate across the one or more dielectric membranes 106 to a position adjacent to the one or more device layers 102 and can experience a compositional change to polycrystalline silicon. Thereby, the exemplary MILE process 300 can exchange the position of the one or more metal layers 108 and resistor layers 104 and form the one or more modified layers 302. Moreover, some residual material from the one or more resistor layers 104 can remain in the initial position and thereby be comprised within one or more metal layers 108 subsequent to the MILE (e.g., the exemplary MILE process 300).

Figure 4:
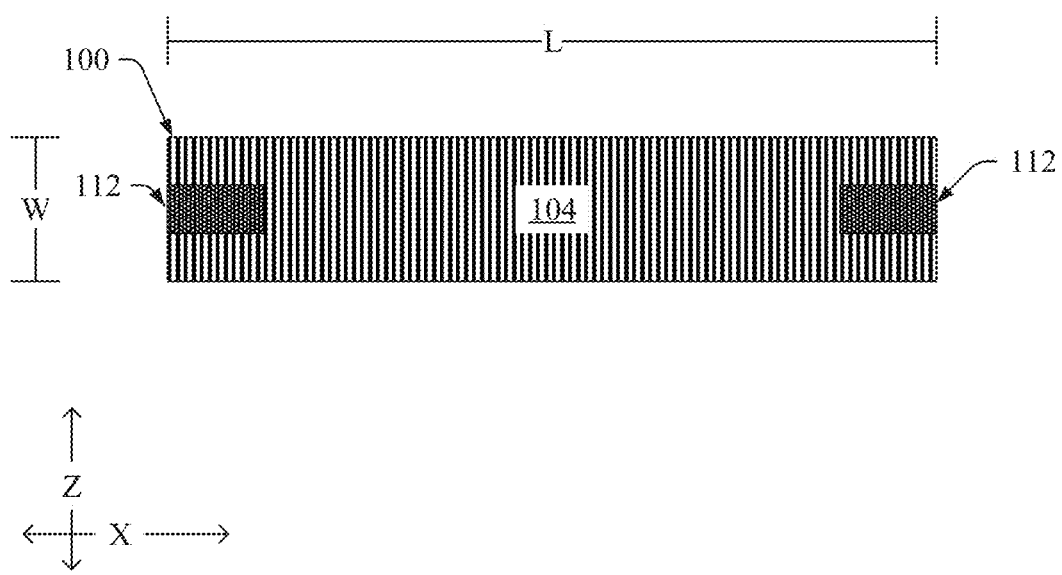
FIG. 4 illustrates a diagram of an example, non-limiting top-down view of a monitor that can detect the operability of a semiconductor device using a metal-induced layer exchange in accordance with one or more embodiments described herein.

FIG. 4 illustrates a diagram of an example, non-limiting top-down view of the monitor device 100 in accordance with one or more embodiments described herein. Repetitive description of like elements employed in other embodiments described herein is omitted for sake of brevity. For clarity, the one or more dielectric layers 110 are not shown in FIG. 4. The monitor device 100 can have a length (e.g., represented by the "L" arrow) that is, for example, greater than or equal to 50 nm and less than or equal to 500 μm. Also, the monitor device 100 can have a width (e.g., represented by the "W" arrow) that is, for example, greater than or equal to 20 nm and less than or equal to 10 μm.

Figure 5:
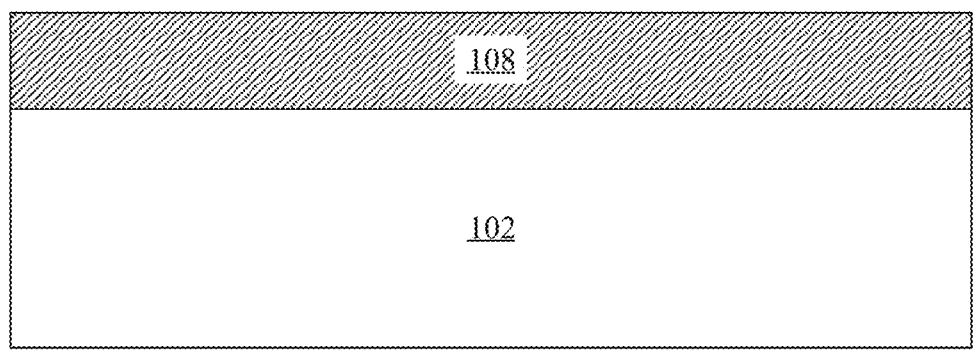
FIG. 5 illustrates a diagram of an example, non-limiting monitor during a first stage of manufacturing, which can detect the operability of a semiconductor device using a metal-induced layer exchange in accordance with one or more embodiments described herein.
Figure 5:
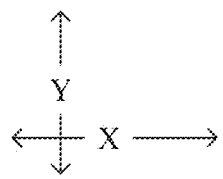

FIG. 5 illustrates a diagram of the example, non-limiting monitor device 100 during a first stage of manufacturing the structure depicted in FIG. 1A in accordance with one or more embodiments described herein. Repetitive description of like elements employed in other embodiments described herein is omitted for sake of brevity. As shown in FIG. 5, the first stage of manufacturing the structure depicted in FIG.

1A can comprise depositing the one or more metal layers 108 onto the one or more device layers 102 via one or more deposition processes (e.g., via physical vapor deposition (PVD), ALD, CVD, MOCVD, PECVD, or combinations thereof). Alternatively, the first stage of manufacturing the structure depicted in FIG. 1B can comprise depositing the one or more resistor layers 104 onto the one or more device layers 102 via one or more deposition processes (e.g., via PVD).

Figure 6:
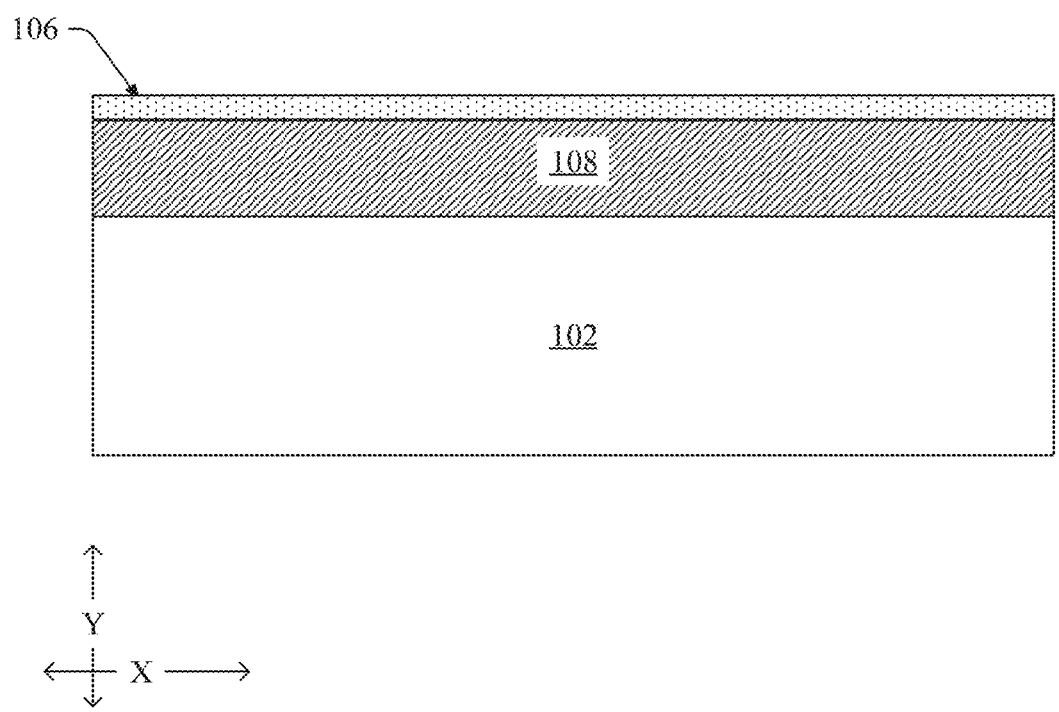
FIG. 6 illustrates a diagram of an example, non-limiting monitor during a second stage of manufacturing, which can detect the operability of a semiconductor device using a metal-induced layer exchange in accordance with one or more embodiments described herein.

FIG. 6 illustrates a diagram of the example, non-limiting monitor device 100 during a second stage of manufacturing the structure depicted in FIG. 1A in accordance with one or more embodiments described herein. Repetitive description of like elements employed in other embodiments described herein is omitted for sake of brevity. As shown in FIG. 6, the second stage of manufacturing the structure depicted in FIG. 1A can comprise depositing the one or more dielectric membranes 106 onto the one or more metal layers 108 via one or more deposition processes (e.g., via ALD).

In one or more embodiments, the one or more dielectric membranes 106 can comprise a metal oxide of one or more metals comprised within the one or more metal layers 108. Thereby, the one or more dielectric membranes 106 can be formed by oxidizing the top surface of the one or more metal layers 108 (e.g., via ALD). Alternatively, the second stage of manufacturing the structure depicted in FIG. 1B can comprise depositing the one or more dielectric membranes 106 onto the one or more resistor layers 104 via one or more deposition processes (e.g., via oxidation).

Figure 7:
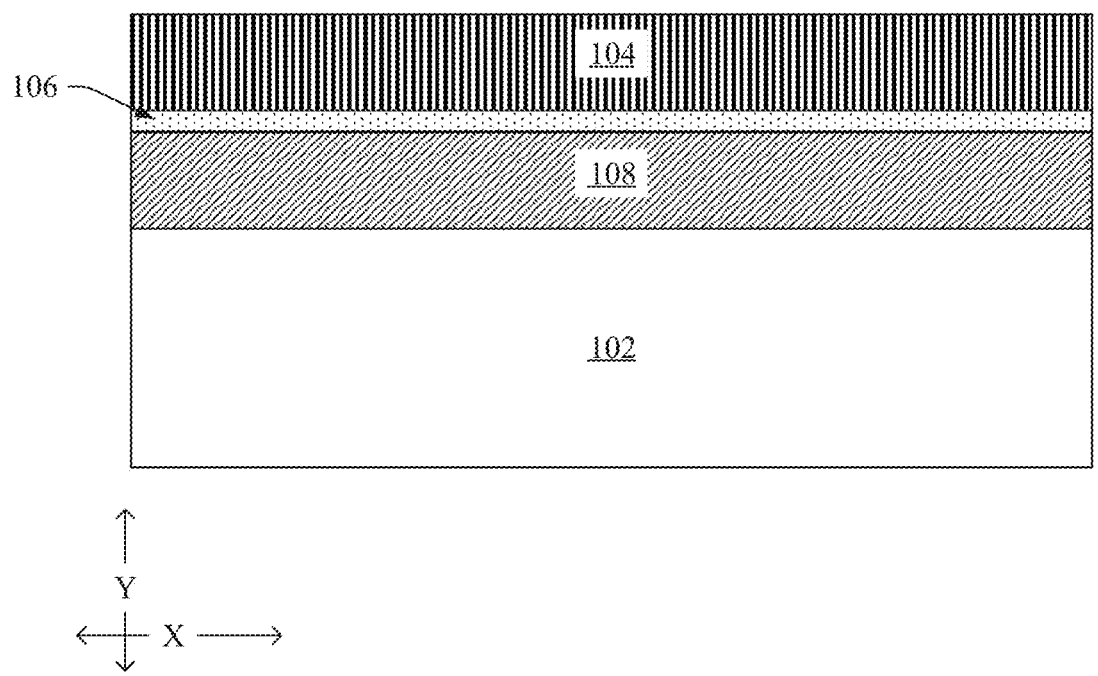
FIG. 7 illustrates a diagram of an example, non-limiting monitor during a third stage of manufacturing, which can detect the operability of a semiconductor device using a metal-induced layer exchange in accordance with one or more embodiments described herein.

FIG. 7 illustrates a diagram of the example, non-limiting monitor device 100 during a third stage of manufacturing the structure depicted in FIG. 1A in accordance with one or more embodiments described herein. Repetitive description of like elements employed in other embodiments described herein is omitted for sake of brevity. As shown in FIG. 7, the third stage of manufacturing the structure depicted in FIG. 1A can comprise depositing the one or more resistor layers 104 onto the one or more dielectric membranes 106 via one or more deposition processes (e.g., via PVD). Alternatively, the third stage of manufacturing the structure depicted in FIG. 1B can comprise depositing the one or more metal layers 108 onto the one or more dielectric membranes 106 via one or more deposition processes (e.g., via PVD).

Figure 8:
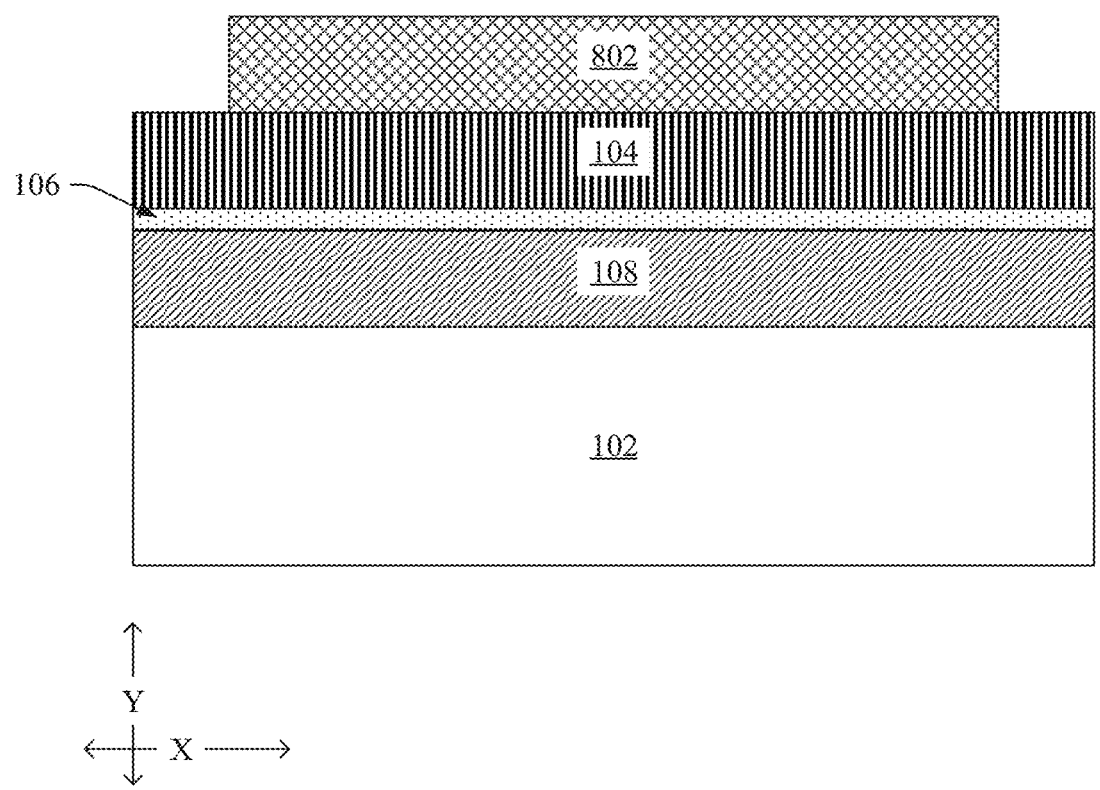
FIG. 8 illustrates a diagram of an example, non-limiting monitor during a fourth stage of manufacturing, which can detect the operability of a semiconductor device using a metal-induced layer exchange in accordance with one or more embodiments described herein.

FIG. 8 illustrates a diagram of the example, non-limiting monitor device 100 during a fourth stage of manufacturing the structure depicted in FIG. 1A in accordance with one or more embodiments described herein. Repetitive description of like elements employed in other embodiments described herein is omitted for sake of brevity. As shown in FIG. 8, the fourth stage of manufacturing the structure depicted in FIG. 1A can comprise depositing the one or more mask layers 802 onto the one or more resistor layers 104 via one or more deposition processes (e.g., via spin-on coating followed by lithography). Alternatively, the fourth stage of manufacturing the structure depicted in FIG. 1B can comprise depositing the one or more mask layers 802 onto the one or more metal layers 108 via one or more deposition processes (e.g., via CVD followed by patterning techniques).

In various embodiments, the one or more mask layers 802 can be disposed over the portions of the one or more resistor layers 104, dielectric membranes 106, and/or metal layers 108 that can become the monitor device 100. For example, the one or more mask layers 802 can protect at least a portion of the one or more resistor layers 104, dielectric membranes 106, and/or metal layers 108 from subsequent etching processes. The one or more mask layers 802 can be hard masks or soft masks. Example materials that can be comprised within the one or more mask layers 802 can include, but are not limited to: photoresist, organic planarization layer (OPL), hard mask material such as silicon carbide, silicon nitride, silicon oxynitride, anti-reflection coating (ARC), a combination thereof, and/or the like. An exemplary thickness (e.g., along the "Y" axis) of the one or more mask layers 802 can be greater than or equal to 50 nm and less than or equal to 1 µm.

Figure 9:
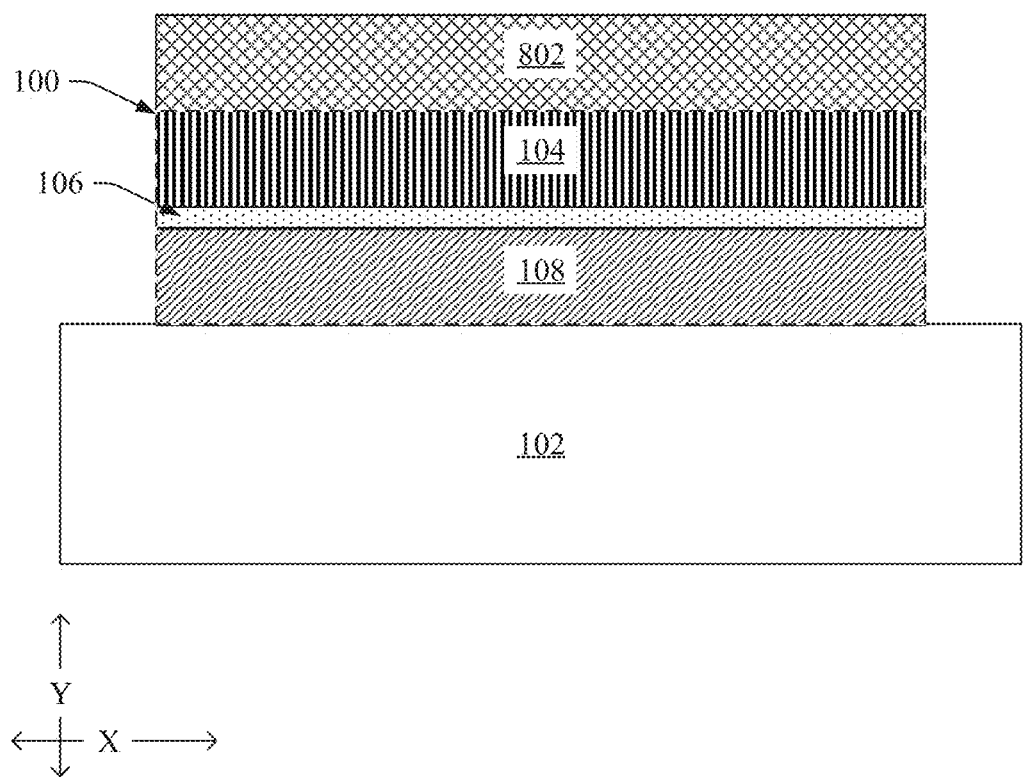
FIG. 9 illustrates a diagram of an example, non-limiting monitor during a fifth stage of manufacturing, which can detect the operability of a semiconductor device using a metal-induced layer exchange in accordance with one or more embodiments described herein.

FIG. 9 illustrates a diagram of the example, non-limiting monitor device 100 during a fifth stage of manufacturing the structures depicted in FIGS. 1A and/or 1B in accordance with one or more embodiments described herein. Repetitive description of like elements employed in other embodiments described herein is omitted for sake of brevity. As shown in FIG. 9, the fifth stage of manufacturing the structures depicted in FIGS. 1A and/or 1B can comprise forming the monitor device 100 by removing exposed portions of the one or more resistor layers 104, dielectric membranes 106, and/or metal layers 108 via one or more etching processes (e.g., via dry etch (e.g., reactive ion etch (RIE)), wet etch, or a combination of both dry and wet etch processes). The exposed portions can be portions of the one or more resistor layers 104, dielectric membranes 106, and/or metal layers 108 not protected by the one or more mask layers 802.

Figure 10:
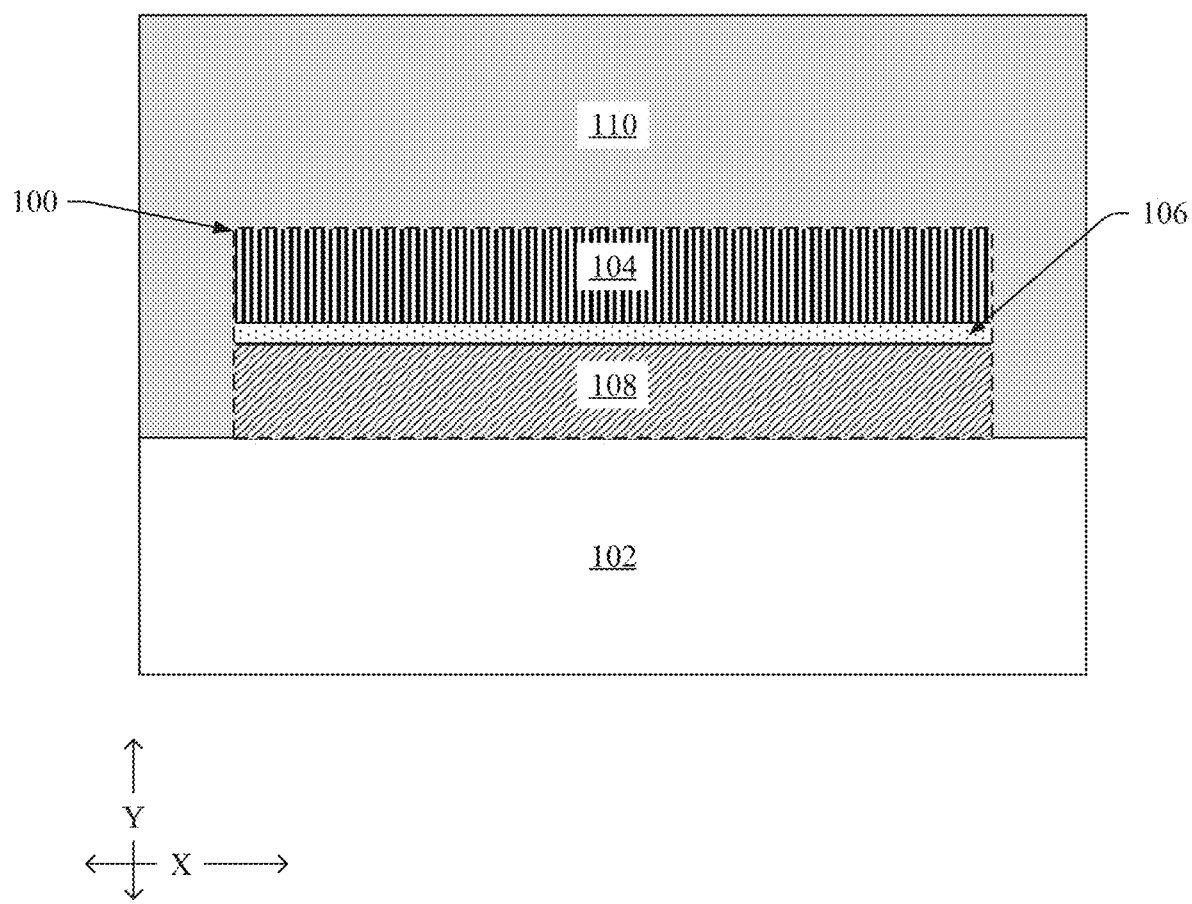
FIG. 10 illustrates a diagram of an example, non-limiting monitor during a sixth stage of manufacturing, which can detect the operability of a semiconductor device using a metal-induced layer exchange in accordance with one or more embodiments described herein.

FIG. 10 illustrates a diagram of the example, non-limiting monitor device 100 during a sixth stage of manufacturing the structures depicted in FIGS. 1A and/or 1B in accordance with one or more embodiments described herein. Repetitive description of like elements employed in other embodiments described herein is omitted for sake of brevity. As shown in FIG. 10, the sixth stage of manufacturing the structures depicted in FIGS. 1A and/or 1B can comprise depositing the one or more dielectric layers 110 onto the one or more monitor devices 100 via one or more deposition processes (e.g., via PVD, CVD, spin-on-coating). For example, the one or more mask layers 802 can be removed from the one or more monitor devices 100 via one or more removal processes prior to depositing the one or more dielectric layers 110.

Additionally, one or more vias can be formed within the one or more dielectric layers 110 and filled with electrically conductive material to form the one or more contacts 112. The one or more vias can extend through the one or more dielectric layers 110 to the monitor device 100 to facilitate the monitor device 100 being operably coupled to the one or more contacts 112 (e.g., as shown in FIGS. 1A and/or 1B).

Figure 11:
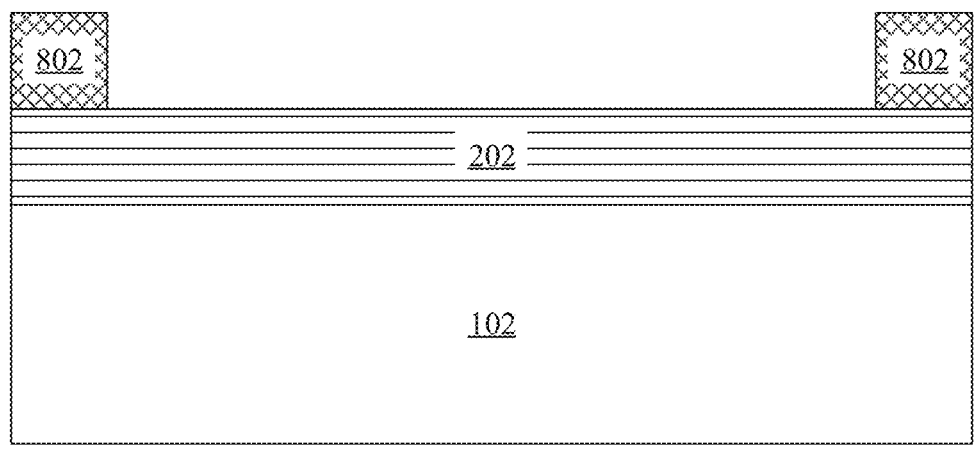
FIG. 11 illustrates a diagram of an example, non-limiting monitor during an alternate first stage of manufacturing, which can detect the operability of a semiconductor device using a metal-induced layer exchange in accordance with one or more embodiments described herein.

FIG. 11 illustrates a diagram of the example, non-limiting monitor device 100 during a first stage of manufacturing the structures depicted in FIGS. 2A and/or 2B in accordance with one or more embodiments described herein. Repetitive description of like elements employed in other embodiments described herein is omitted for sake of brevity. As shown in FIG. 11, the first stage of manufacturing the structures depicted in FIGS. 2A and/or 2B can comprise depositing the one or more second dielectric layers 202 onto the one or more device layers 102 via one or more deposition processes (e.g., via PVD, CVD, spin-on-coating).

Further, the first stage of manufacturing the structures depicted in FIGS. 2A and/or 2B can comprise depositing one or more mask layers 802 onto the one or more second dielectric layers 202 at positions other than where the monitor device 100 can be subsequently formed. For example, the one or more mask layers 802 can be deposited over portions of the one or more second dielectric layers 202 that can remain on the one or more device layers 102 after one or more subsequent etching processes. The one or more mask layers 802 can be deposited via one or more deposition processes (e.g., via spin-on-coating).

Figure 12:
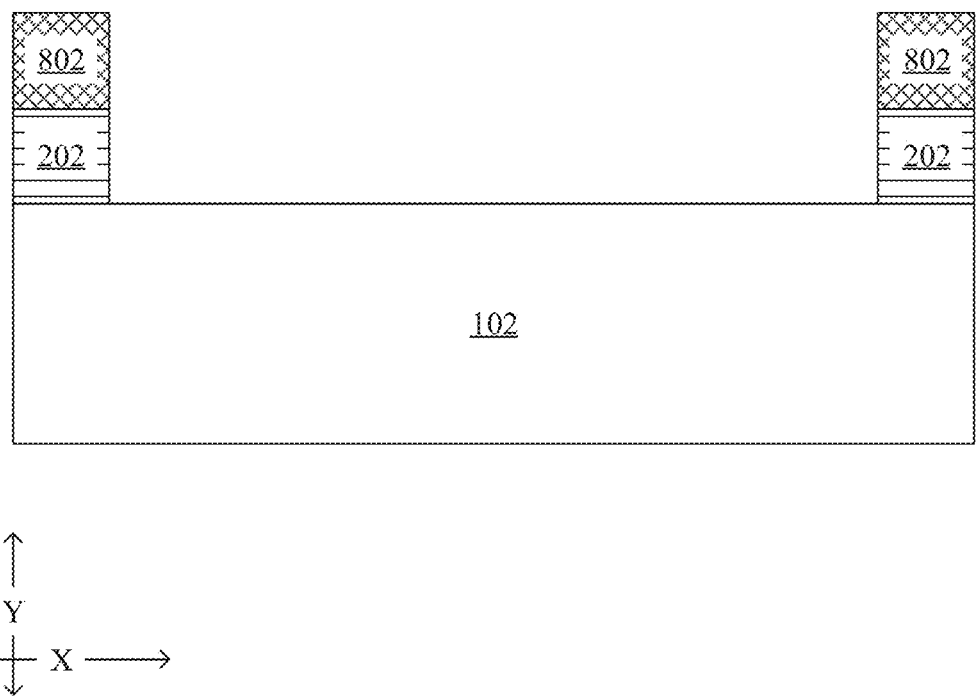
FIG. 12 illustrates a diagram of an example, non-limiting monitor during an alternate second stage of manufacturing, which can detect the operability of a semiconductor device using a metal-induced layer exchange in accordance with one or more embodiments described herein.

FIG. 12 illustrates a diagram of the example, non-limiting monitor device 100 during a second stage of manufacturing the structures depicted in FIGS. 2A and/or 2B in accordance with one or more embodiments described herein. Repetitive description of like elements employed in other embodiments described herein is omitted for sake of brevity. As shown in FIG. 12, the second stage of manufacturing the structures depicted in FIGS. 2A and/or 2B can comprise removing exposed portions of the one or more second dielectric layers 202 from the one or more device layers 102. In various embodiments, the exposed portions can be portions of the one or more second dielectric layers 202 not protected by the one or more mask layers 802.

Figure 13:
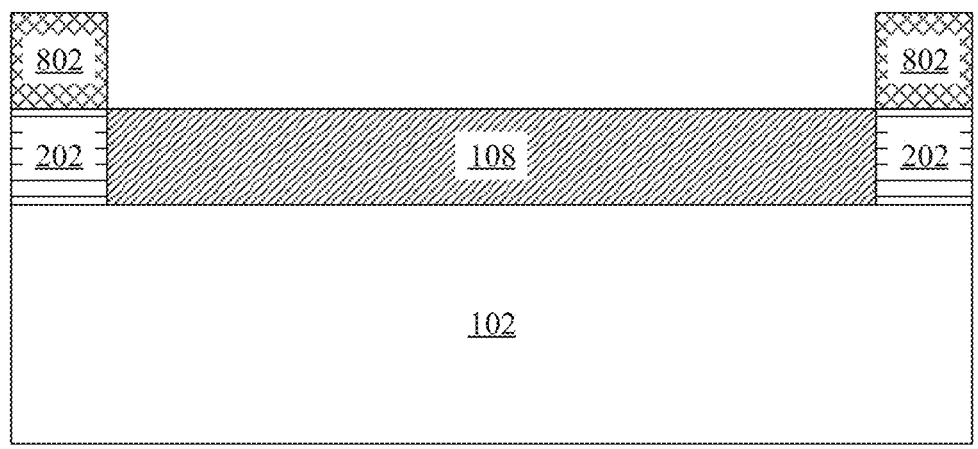
FIG. 13 illustrates a diagram of an example, non-limiting monitor during an alternate third stage of manufacturing, which can detect the operability of a semiconductor device using a metal-induced layer exchange in accordance with one or more embodiments described herein.
Figure 13:
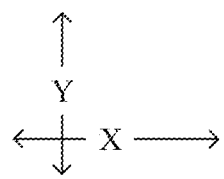

FIG. 13 illustrates a diagram of the example, non-limiting monitor device 100 during a third stage of manufacturing the structure depicted in FIG. 2A in accordance with one or more embodiments described herein. Repetitive description of like elements employed in other embodiments described herein is omitted for sake of brevity. As shown in FIG. 13, the third stage of manufacturing the structure depicted in FIG. 2A can comprise depositing the one or more metal layers 108 onto the one or more device layers 102 and between the remaining portions of the one or more second dielectric layers 202 via one or more deposition processes (e.g., via PVD). Alternatively, the third stage of manufacturing the structure depicted in FIG. 2B can comprise depositing the one or more resistor layers 104 onto the one or more device layers 102 and between the remaining portions of the one or more second dielectric layers 202 via one or more deposition processes (e.g., via PVD).

Figure 14:
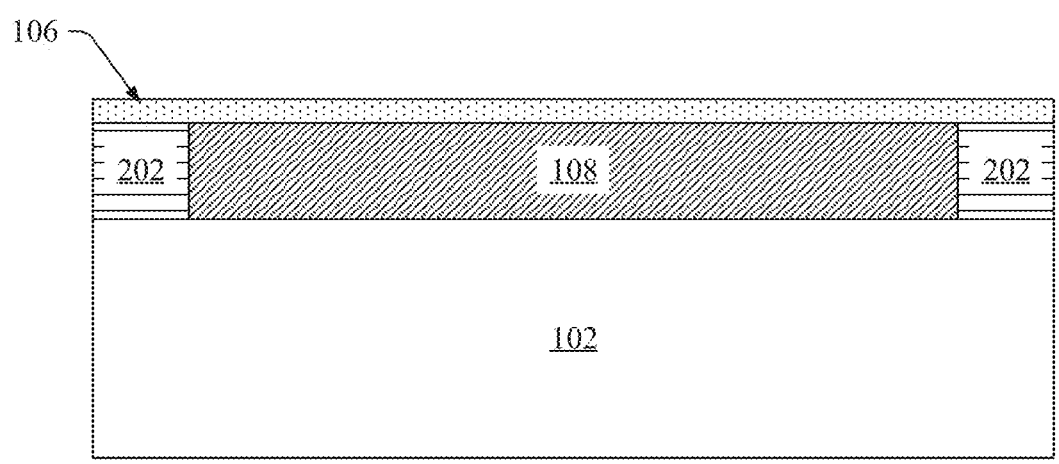
FIG. 14 illustrates a diagram of an example, non-limiting monitor during an alternate fourth stage of manufacturing, which can detect the operability of a semiconductor device using a metal-induced layer exchange in accordance with one or more embodiments described herein.

FIG. 14 illustrates a diagram of the example, non-limiting monitor device 100 during a fourth stage of manufacturing the structure depicted in FIG. 2A in accordance with one or more embodiments described herein. Repetitive description of like elements employed in other embodiments described herein is omitted for sake of brevity. As shown in FIG. 14, the fourth stage of manufacturing the structure depicted in FIG. 2A can comprise depositing the one or more dielectric membranes 106 onto the one or more metal layers 108 and/or second dielectric layers 202 via one or more deposition processes (e.g., via CVD and/or spin-coating). Alternatively, the fourth stage of manufacturing the structure depicted in FIG. 2B can comprise depositing the one or more dielectric membranes 106 onto the one or more resistor layers 104 and/or second dielectric layers 202 via one or more deposition processes (e.g., via CVD and/or spin-coating). For example, the fourth stage of manufacturing the structure depicted in FIGS. 2A and/or 2B can comprise removing the one or more mask layers 802 via one or more removal processes prior to deposition of the one or more dielectric membranes 106.

Furthermore, manufacturing of the structures depicted in FIGS. 2A and/or 2B comprise the same manufacturing steps described herein with regards to FIGS. 7-10. For example, one or more resistor layers 104 can be deposited onto the one or more dielectric membranes 106 via one or more deposition processes (e.g., via CVD and/or spin-coating). Alternatively, to facilitate manufacturing of the structure depicted in FIG. 2B, the one or more metal layers 108 can be deposited onto the one or more dielectric membranes 106 via one or more deposition processes (e.g., via PVD). Additionally, the one or more mask layers 802 can be deposited onto the one or more resistor layers 104 via one or more deposition processes (e.g., via spin-on-coating). Alternatively, to facilitate manufacturing of the structure depicted in FIG. 2B, the one or more mask layers 802 can be deposited onto the one or more metal layers 108 via one or more deposition processes (e.g., via PVD). In various embodiments, the one or more mask layers 802 can be disposed over the portions of the one or more resistor layers 104, dielectric membranes 106, and/or metal layers 108 that can become the monitor device 100.

Figure 15:
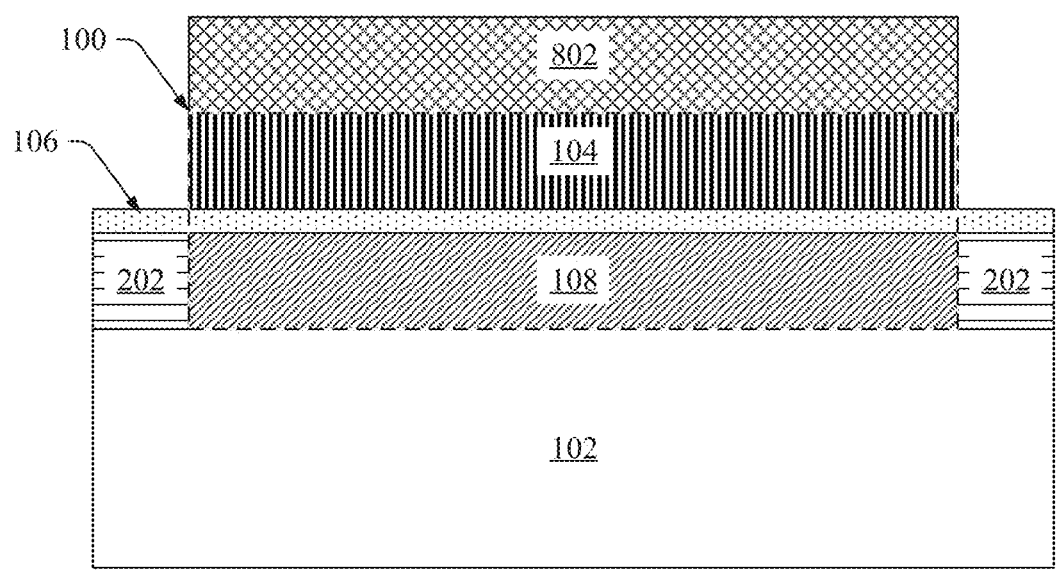
FIG. 15 illustrates a diagram of an example, non-limiting monitor during a stage of manufacturing, which can detect the operability of a semiconductor device using a metal-induced layer exchange in accordance with one or more embodiments described herein.

Moreover, the monitor device 100 can be formed by removing exposed portions of the one or more resistor layers 104 via one or more etching processes (e.g., via RIE). The exposed portions can be portions of the one or more resistor layers 104 not protected by the one or more mask layers 802. For instance, FIG. 15 illustrates a diagram of the example, non-limiting monitor device 100 depicted in FIG. 2A subsequent to the one or more etching processes. Repetitive description of like elements employed in other embodiments described herein is omitted for sake of brevity. As shown in FIG. 15, the one or more etching processes can remove exposed portions of the one or more resistor layers 104 (e.g., portions not protected by the one or more mask layers 802) while leaving the one or more dielectric membranes 106 positioned on the one or more second dielectric layers 202. Alternatively, to facilitate manufacturing of the structure depicted in FIG. 2B, the monitor device 100 can be formed by removing exposed portions of the one or more metal layers 108 via one or more etching processes (e.g., via RIE). The exposed portions can be portions of the one or more metal layers 108 not protected by the one or more mask layers 802 (e.g., wherein the one or more metal layers 108 are positioned on the one or more dielectric membrane layers 106).

In addition, the one or more dielectric layers 110 can be deposited onto the monitor device 100 via one or more deposition processes (e.g., via CVD and/or spin-on coating). For example, the one or more mask layers 802 can be removed from the one or more monitor devices 100 via one or more removal processes prior to depositing the one or more dielectric layers 110. Also, one or more vias can be formed within the one or more dielectric layers 110 and filled with electrically conductive material to form the one or more contacts 112. The one or more vias can extend through the one or more dielectric layers 110 to the monitor device 100 to facilitate the monitor device 100 being operably coupled to the one or more contacts 112 (e.g., as shown in FIGS. 2A and/or 2B).

FIG. 16 illustrates a flow diagram of an example, non-limiting method 1600 that can facilitate using the monitor device 100 in accordance with one or more embodiments described herein. Repetitive description of like elements employed in other embodiments described herein is omitted for sake of brevity.

At 1602, the method 1600 can comprise monitoring an electrical current traveling through one or more monitors (e.g., one or more monitor devices 100) positioned adjacent to one or more semiconductor devices, wherein an amount of electrical current traveling through the one or more monitors can be a function of a MILE within the one or more monitors. For example, the one or more monitors can be one or more monitor devices 100 described herein with a structure depicted, for example, in FIGS. 1A-2B. The one or more monitor devices 100 can be positioned on one or more device layers 102 of the one or more adjacent semiconductor devices. Further, the monitoring at 1602 can be facilitated by one or more electrical current measuring devices (e.g., ammeters and/or the like) operably coupled to the one or more monitor devices 100 (e.g., via one or more contacts 112).

As described herein, the MILE can facilitate an exchange between one or more resistor layers 104 and metal layers 108 comprised within the one or more monitors (e.g., comprised within the one or more monitor devices 100). The MILE can also modify a composition of the one or more resistor layers 104 (e.g., forming one or more modified layers 302). Moreover, the MILE can be catalyzed by heat. As a result of the MILE, the material operably coupled to the one or more electrical current measuring devices (e.g., ammeters and/or the like) can change (e.g., from resistor layer 104 material to metal layer 108 material or from metal layer 108 material to modified layer 302 material). As the material operably coupled to the one or more electrical current measuring devices (e.g., ammeters and/or the like) changes, so to can the electrical resistance of the one or more monitors (e.g., monitor devices 100) and thereby the amount of current traveling through the one or more monitors (e.g., monitor devices 100).

At 1604, the method 1600 can comprise determining an operability of the one or more semiconductor devices based on the monitoring at 1602. For example, operation of the one or more semiconductor devices can affect the MILE within the one or more monitors (e.g., monitor devices 100). As described herein, the MILE can be catalyzed by heat generated by the one or more semiconductor devices. Thus, the longer the one or more semiconductor devices operate, the further MILE progresses, and thereby the greater the change in electrical current flow monitored at 1602.

The operability of the one or more semiconductor devices can be a function of the operating time of the one or more semiconductor devices. For example, the longer the one or more semiconductor devices operate, the higher the likelihood of operation errors and/or failure. Thus, the one or more semiconductor devices can be characterized by an operable lifetime. For instance, manufacturers of the one or more semiconductor devices can determine an operable lifetime of the one or more semiconductor devices based one or more performance tests.

Additionally, an operator of the one or more monitors (e.g., monitor devices 100) can know various MILE information, including, but not limited to: how long the catalyzed MILE will take to complete based on at least the structural features (e.g., dimension and/or composition) of the one or more monitors (e.g., monitor devices 100) and/or prior knowledge of the MILE process; and/or the amount of current that can travel through the one or more monitors (e.g., monitor devices 100) at one or more points of progression of the MILE. Thus, the amount of current traveling through the one or more monitors (e.g., monitor devices 100) can be indicative of the amount of progression of the MILE, and thereby the amount of operation performed by the one or more semiconductor devices (e.g., the operating time of the one or more semiconductor devices).

Further, one or more defined current thresholds can be used to determine the operability of the one or more semiconductor devices. The one or more current thresholds can be based on the operable lifetime of the one or more semiconductor devices and the MILE information of the one or more monitors (e.g., monitor devices 100). For example, one or more current thresholds can be associated with one or more stages of the MILE process corresponding to landmarks in the operable lifetime of the one or more semiconductor devices. For instance, a current threshold can be associated with a stage of the MILE process that can be facilitate by the one or more semiconductor devices operating for half the operable lifetime. In another instance, a current threshold can be associated with a stage of the MILE process that can be facilitate by the one or more semiconductor devices operating for the entirety, or near entirety, of the operable lifetime.

Moreover, the determining at 1604 can be performed by one or more computer entities (e.g., comprising one or more processors). For example, one or more computer entities can comprise one or more processors that can execute program instructions stored in one or more memories. The one or more computing entities can receive results of the monitoring at 1602 (e.g., via a direct connection or wireless connection to one or more current measuring devices coupled to the one or more monitor devices 100) and compare the results to one or more defined thresholds. The one or more computer entities can determine an operability of the one or more semiconductor devices based on the electrical current flow monitored at 1602 exceeding (e.g., the current flow being greater than a current threshold or less than a current threshold) or not exceeding the one or more current thresholds. For example, the one or more computer entities can determine that the one or more semiconductor devices are inoperable based on the current flow monitored at 1602 exceeding a current threshold (e.g., being greater than a current threshold or less than a current threshold). For instance, wherein the one or more monitors (e.g., monitor devices 100) comprise the structure depicted in FIG. 1A or 2A, the one or more computer entities can determine that the one or more semiconductor devices are inoperable based on the current flow monitored at 1602 being greater than a defined current threshold. In another instance, wherein the one or more monitors (e.g., monitor devices 100) comprise the structure depicted in FIG. 1B or 2B, the one or more computer entities can determine that the one or more semiconductor devices are inoperable based on the current flow monitored at 1602 being less than a defined current threshold.

FIG. 17 illustrates a flow diagram of an example, non-limiting method 1700 that can facilitate manufacturing the monitor device 100 in accordance with one or more embodiments described herein. Repetitive description of like elements employed in other embodiments described herein is omitted for sake of brevity.

At 1702, the method 1700 can comprise depositing one or more dielectric membranes 106 on one or more amorphous semiconductor resistor layers (e.g., one or more resistor layers 104). For example, the depositing at 1702 can be performed in accordance with FIGS. 7 and/or 15 and the corresponding description of the stages of manufacturing described herein. The depositing at 1702 can be facilitated by one or more deposition processes. Example materials that can be comprised within the one or more amorphous semiconductor resistor layers (e.g., resistor layers 104) can include, but are not limited to: amorphous silicon (aSi), amorphous germanium (aGe), amorphous silicon-germanium (aSi/Ge), a combination thereof, and/or the like. Example materials that can be comprised within the one or more dielectric membranes 106 can include, but are not limited to: metal oxides (e.g., aluminum oxide ($Al_2O_3$)), silicon oxide, germanium oxide, a combination thereof, and/or the like.

At 1704, the method 1700 can comprise depositing the one or more dielectric membranes 106 further on one or more electrically conductive metal layers (e.g., metal layers 108), wherein the one or more electrically conductive metal layers (e.g., metal layers 108), dielectric membranes 106, and/or amorphous semiconductor resistor layers (e.g., resistor layers 104) can form a monitor (e.g., monitor device 100) that can experience a MILE in the presence of heat. For example, the depositing at 1704 can be performed in accordance with FIGS. 6 and/or 14 and the corresponding description of the stages of manufacturing described herein. The depositing at 1704 can be facilitated by one or more deposition processes. Example materials that can be comprised within the one or more electrically conductive metal layers (e.g., metal layers 108) can include but are not limited to: aluminum (Al), gold (Au), silver (Ag), antimony (Sb), indium (In), nickel (Ni), cobalt (Co), titanium (Ti), zinc (Zn), iron (Fe), platinum (Pt), tin (Sn), palladium (Pd), tungsten (W), molybdenum (Mo), niobium (Nb), zirconium (Zr), hafnium (Hf), Tantalum (Ta), Ruthenium (Ru), yttrium (Y), lanthanum (La), a combination thereof, and/or the like.

In various embodiments, the depositing at 1702 can precede the depositing at 1704 to facilitate manufacturing of monitor devices 100 having a structure depicted in FIGS. 1B and/or 2B. Alternatively, in various embodiments, the depositing at 1704 can precede the depositing at 1702 to facilitate manufacturing of monitor devices 100 having a structure depicted in FIGS. 1A and/or 2A.

Also, the method 1700 can comprise positioning the monitor (e.g., monitoring device 100) adjacent to one or more semiconductor devices, wherein the monitor (e.g., monitoring device 100) can detect an operability of the semiconductor device based on the MILE (e.g., as described herein). For example, the one or more electrically conductive metal layers (e.g., metal layers 108) or amorphous semiconductor resistor layers (e.g., resistor layers 104) can be deposited onto one or more device layers 102 of the one or more semiconductor devices (e.g., in accordance with FIGS. 5 and/or 13 and the corresponding description of the stages of manufacturing described herein).

Further, the method 1700 can comprise depositing one or more dielectric materials at least partially surrounding the monitor (e.g., monitor device 100). For example, the one or more dielectric layers 110 can be deposited (e.g., via one or more deposition processes) onto the monitor (e.g., monitor device 100) in accordance with FIG. 10 and the corresponding description of the stages of manufacturing described herein. Moreover, the method 1700 can comprise forming a plurality of electrically conductive metal contacts (e.g., contacts 112) within the one or more dielectric materials (e.g., dielectric layers 110) and operably coupled to the monitor. For example, one or more vias can be formed in the one or more dielectric materials, which can then be filled with electrically conductive metal to form the contacts 112.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
   a dielectric membrane positioned between a first layer and a second layer, wherein the first layer is provided directly on a device layer and the second layer is provided directly on the dielectric membrane, and wherein the dielectric membrane is provided between and directly connected to the first layer and the second layer;
   contacts directly disposed on either end of a same side of the second layer,
      wherein the first layer is an electronically conductive metal layer adapted to have a first resistivity at a first time and the second layer is adapted to be an amorphous semiconductor resistor layer at the first time,
      wherein material of the second layer is adapted to enable a metal induced layer exchange causing the material to migrate through the dielectric membrane from the amorphous semiconductor resistor layer into a modified version of the first layer with increased resistivity of the modified version of the first layer at a second time later than the first time, and
      wherein the metal induced layer exchange is initiated by catalyzation by heat generated from a semiconductor device adjacent the apparatus.

2. The apparatus of claim 1, wherein the dielectric membrane includes at least one material selected from a group consisting of a dielectric film and a metal oxide dielectric.

3. The apparatus of claim 2, wherein the dielectric membrane is aluminum oxide.

4. The apparatus of claim 2, wherein the amorphous semiconductor resistor layer includes at least one member selected from a second group consisting of amorphous silicon, amorphous germanium, amorphous silicon-germanium, phosphorus, arsenic, antimony, boron, gallium, and indium.

5. The apparatus of claim 4, wherein the amorphous semiconductor resistor layer comprises amorphous silicon-germanium.

6. The apparatus of claim 4, wherein the electrically conductive metal layer includes at least one other member selected from a third group consisting of copper, aluminum, gold, silver, antimony, indium, nickel, cobalt, titanium, zinc, iron, platinum, tin, palladium, tungsten, molybdenum, niobium, zirconium, hafnium, tantalum, ruthenium, yttrium, and lanthanum.

7. The apparatus of claim 6, wherein the electrically conductive metal layer is aluminum.

8. The apparatus of claim 1, wherein the heat creates an annealing temperature greater than or equal to 40 degrees Celsius and less than or equal to 250 degrees Celsius.

\* \* \* \* \*